(12) United States Patent
Kim et al.

(10) Patent No.: US 9,059,717 B2
(45) Date of Patent: Jun. 16, 2015

(54) APPARATUS FOR FREQUENCY COMPENSATION USING TWO COUNTERS

(71) Applicant: Samsung Electronics Co., Ltd., Suwon-si, Gyeonggi-do (KR)

(72) Inventors: Tae-Pyeong Kim, Suwon-si (KR); Han-Kyul Lim, Seoul (KR); Dong-Uk Park, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/147,184

(22) Filed: Jan. 3, 2014

(65) Prior Publication Data

US 2014/0191785 A1  Jul. 10, 2014

(30) Foreign Application Priority Data

Jan. 7, 2013  (KR) .................. 10-2013-0001621

(51) Int. Cl.
  *H03K 3/011* (2006.01)
  *H03L 1/02* (2006.01)
  *G04G 3/02* (2006.01)

(52) U.S. Cl.
  CPC ............. *H03L 1/027* (2013.01); *G04G 3/022* (2013.01); *H03K 3/011* (2013.01)

(58) Field of Classification Search
  CPC .................................................. G04G 3/022
  USPC ......... 327/113, 115, 117, 141, 144, 145, 146, 327/147, 148, 151, 154, 156, 157, 160, 291, 327/292, 298; 377/20, 25, 47
  See application file for complete search history.

(56) References Cited

U.S. PATENT DOCUMENTS

| | | | |
|---|---|---|---|
| 5,828,248 A * | 10/1998 | Masuda ........................ | 327/113 |
| 6,043,720 A | 3/2000 | Van Veenendaal et al. | |
| 7,126,434 B2 | 10/2006 | Lee | |
| 7,227,422 B2 | 6/2007 | Yarborough, Jr. | |
| 7,355,482 B2 | 4/2008 | Meltzer | |
| 7,446,592 B2 | 11/2008 | Tripathi et al. | |
| 7,495,465 B2 | 2/2009 | Khan et al. | |
| 7,538,619 B2 | 5/2009 | Kim | |
| 7,619,486 B1 | 11/2009 | Lesea | |
| 8,692,594 B2 * | 4/2014 | Foxcroft et al. ............... | 327/156 |

FOREIGN PATENT DOCUMENTS

| | | |
|---|---|---|
| JP | 2008-311884 A | 12/2008 |
| JP | 2011-35482 A | 2/2011 |
| KR | 10-0386931 B1 | 6/2003 |
| KR | 10-0434432 B1 | 6/2004 |
| KR | 10-2005-0041571 A | 5/2005 |
| KR | 10-2005-0082556 A | 8/2005 |
| KR | 10-2001-0130154 A | 12/2011 |
| KR | 10-1104720 B1 | 1/2012 |

* cited by examiner

*Primary Examiner* — Lincoln Donovan
*Assistant Examiner* — Jung Kim
(74) *Attorney, Agent, or Firm* — Myers Bigel Sibley & Sajovec P.A.

(57) ABSTRACT

A frequency compensation apparatus includes a first counter setting a reference period using a main clock, a second counter sensing a change in the frequency of a sub clock using the reference period, and a frequency compensator providing a compensated frequency using information on the changed frequency of the sub clock. Related methods are also described.

11 Claims, 4 Drawing Sheets

APPARATUS FOR FREQUENCY COMPENSATION USING TWO COUNTERS

CROSS-REFERENCE TO RELATED APPLICATION

This U.S. non-provisional application claims priority under 35 U.S.C. §119 from Korean Patent Application No. 10-2013-0001621 filed Jan. 7, 2013, the entirety of which is hereby incorporated herein by reference.

BACKGROUND

The present inventive concepts relate to apparatus and methods for frequency compensation.

An oscillator is used in providing a timing signal of an electronic device, including a computer, a system, or a communication device. The oscillating frequency of the oscillator may vary according to the change in external circumstances, such as process, voltage and temperature. Therefore, in order to secure system stability, it is desirable to compensate for the varied frequency of the oscillator.

SUMMARY

The present inventive concepts can provide an apparatus for frequency compensation, which can compensate for the frequency of an oscillator varying according to the process, voltage and temperature.

The present inventive concepts can also provide a method for frequency compensation, which can compensate for the frequency of an oscillator varying according to the process, voltage and temperature.

According to an aspect of the present inventive concepts, there is provided an apparatus for frequency compensation, the frequency compensation apparatus including a first counter setting a reference period using a main clock, a second counter sensing a change in the frequency of a sub clock using the reference period, and a frequency compensator providing a compensated frequency using information on the changed frequency of the sub clock.

According to another aspect of the present inventive concepts, there is provided an apparatus for frequency compensation, the frequency compensation apparatus including a first counter setting the number of reference clock cycles for a main clock and setting a reference period by measuring a time taken to calculate the number of reference clock cycles, a second counter sensing a change in the frequency of a sub clock by calculating the number of clock cycles of the sub clock by calculating the number of clock cycles of the sub clock for a time taken to set the reference period, and a frequency compensator providing a compensated frequency using information on the changed frequency of the sub clock.

According to still another aspect of the present inventive concepts, there is provided a method for frequency compensation, the method including generating a main clock and a sub clock, setting a reference period using the main clock, sensing a change in the frequency of the sub clock using the reference period, and providing a compensated frequency using information on the changed frequency of the sub clock.

According to still another aspect of the present inventive concepts, there is provided an apparatus for frequency compensation comprising a first clock generator configured to generate a first clock, a second clock generator configured to generate a second clock, a first counter that is configured to count clock cycles of the first clock and identify a time duration for the first clock to produce a predetermined number of the clock cycles, a second counter that is configured to count clock cycles of the second clock during a plurality of time intervals corresponding to the time duration and to determine a change in a frequency of the second clock from the clock cycles of the second clock that are counted during the plurality of time intervals corresponding to the time duration, and a frequency compensator that is configured to produce a frequency compensation value from the change in the frequency of the second clock.

BRIEF DESCRIPTION OF THE DRAWINGS

The above and other features and advantages of the present inventive concepts will become more apparent by describing in detail various embodiments thereof with reference to the attached drawings in which.

DETAILED DESCRIPTION

Figure 1:
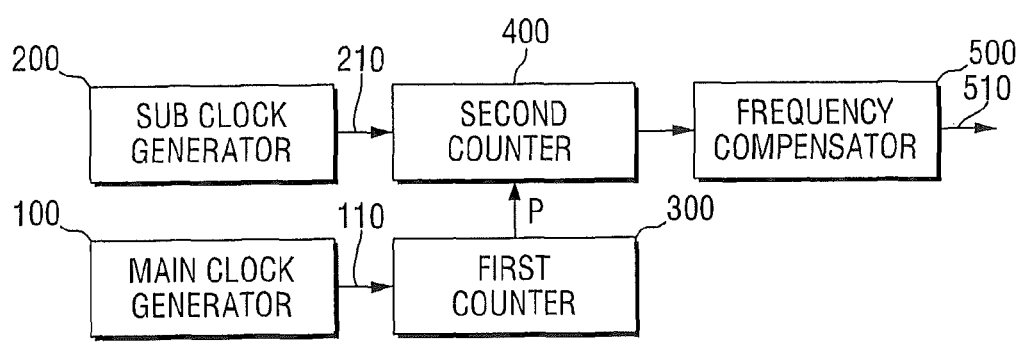
FIG. 1 is a block diagram of an apparatus for frequency compensation according to an embodiment of the present inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that when an element is referred to as being "responsive", "connected" or "coupled" to another element, it can be directly responsive, connected or coupled to the other element or intervening elements may be present. In contrast, when an element is referred to as being "directly responsive", "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

Unless defined otherwise, all technical and scientific terms used herein have the same meaning as commonly understood by one of ordinary skill in the art to which this invention belongs. It is noted that the use of any and all examples or terms provided herein is intended merely to better illuminate the invention and is not a limitation on the scope of the invention unless otherwise specified.

The present invention is described in part below with reference to block diagrams of methods, systems and computer program products according to various embodiments. It will be understood that a block of the block diagrams, and combinations of blocks in the block diagrams may be implemented at least in part by computer program instructions. Accordingly, a given block or blocks of the block diagrams provides support for methods, computer program products and/or systems (structural and/or means-plus-function). Finally, the functionality of one or more blocks may be separated and/or combined with that of other blocks.

Various apparatus and methods for frequency compensation, which will be described below, are directed to compensate the changed frequency of an oscillator using an initial frequency of a main clock. The frequency required by the system may be provided by compensating the frequency of the oscillator varied according to the process, voltage and temperature change. In the present inventive concepts, the initial frequency of the main clock is used. Therefore, the present inventive concepts may also be applied to a case where the frequency of the main clock often varies during operation of the system.

FIG. 1 is a block diagram of an apparatus for frequency compensation according to an embodiment of the present inventive concepts.

Referring to FIG. 1, the frequency compensation apparatus may include a main clock generator 100, a sub clock generator 200, a first counter 300, a second counter 400, and a frequency compensator 500.

The main clock generator 100 generates a main clock 110 for system operation. The main clock generator 100 may be, for example, a crystal oscillator circuit. The crystal oscillator circuit may include an inverter, a feedback resistor, a crystal oscillator, a capacitor, and an output buffer. The crystal oscillator circuit has AC power input to an input port of the inverter, and noise may be generated through the inverter, the feedback resistor and the capacitor. A crystal oscillator may be oscillated by the noise, and the main clock 110 may be generated through the output buffer. Since the crystal oscillator circuit employs the crystal oscillator, it can generate a more accurate clock than the oscillator circuit. However, the frequency of the clock generated in the crystal oscillator circuit may also vary according to the process, voltage and temperature change.

The sub clock generator 200 generates a sub clock 210 for system operation. The sub clock generator 200 may be an RC oscillator circuit or an LC oscillator circuit. The RC oscillator circuit may be, for example, a Wien-bridge oscillator circuit, a phase shift oscillator circuit, or a Twin-T oscillator circuit, but not limited thereto. The LC oscillator circuit may be, for example, a Colpitts oscillator circuit, a Clapp oscillator circuit, a Hartley oscillator circuit, or an Armstrong oscillator circuit, but not limited thereto. The RC oscillator circuit may be employed in a case where an oscillating frequency is low, and the LC oscillator circuit may be employed in a case where an oscillating frequency is high.

The first counter 300 is a frequency counter that measures frequencies having periodic waveforms. The frequency counter is a digital circuit for processing numerical values by calculating clock pulses. A binary number or a binary coded decimal calculated by the frequency counter may be displayed on a 7-segment light emitting diode through a decoder. The first counter 300 may be, for example, a binary counter, a gray code counter, a ring counter, or a Johnson counter, but not limited thereto. The frequency counter measures a frequency based on the following equation:

$$\text{Frequency} = \frac{\text{Counter Output}}{t}$$

That is to say, when t=1, the displayed numerical value is the frequency, when t=10, a numerical value that is one decimal point increased from the displayed numerical value is the frequency, and when t=0.1, a numerical value that is one decimal point decreased from the displayed numerical value is the frequency.

The first counter 300 sets a reference period P using the main clock 110. The main clock 110 may have frequencies varying according to system operation. However, the frequency value of the main clock 110 at an initial system operation time is known to a system user. In addition, the frequency value of the main clock 110 at an initial system operation time is not variable but is constant. The first counter 300 sets the reference period P using an initial frequency period of the main clock 110. That is to say, the first counter 300 sets the number of reference clock cycles (N) for the main clock 110 in the initial frequency period of the main clock 110, and sets the reference period P by measuring a time taken to calculate the number of reference clock cycles (N). The first counter 300 may set the reference period P and may store the reference period P.

The second counter 400 is a frequency counter that measures frequencies having periodic waveforms. A binary number or a binary coded decimal calculated by the frequency counter may be displayed on a 7-segment light emitting diode through a decoder. The second counter 400 may be, for example, a binary counter, a gray code counter, a ring counter, or a Johnson counter, but not limited thereto.

The second counter 400 senses a change in the frequency of the sub clock 210 using the reference period P. The sub clock 210 may have frequencies varying according to the process, voltage and temperature change during system operation. The second counter 400 senses a change in the frequency of the sub clock 210 by calculating the number of clocks of the sub clock 210 for a time taken to set the reference period P. The second counter 400 may sense the change in the frequency of the sub clock 210 using the reference period P pre-stored in the first counter 300. The second counter 400 may include a plurality of second counters. If signals required by multiple systems have different frequencies, the plurality of second counters 400 may sense the change in the different frequencies of the sub clock 210 using the reference period P pre-stored in the first counter 300.

The frequency compensator 500 provides a compensated frequency 500 using the information on the changed frequency of the sub clock 210. The frequency compensator 500 may be a frequency division circuit, but not limited thereto. The frequency division circuit may be, for example, a frequency half-reducing circuit using a JK flip-flop circuit. That is to say, a first JK flip-flop circuit and a second JK flip-flop circuit are connected to each other in parallel, and the first JK flip-flop circuit generates one output clock Q1 for two input clocks I and the second JK flip-flop circuit generates one output clock Q2 for two input clocks Q1. Through the above-described procedure, the frequency of Q1 becomes half the frequency of the input clocks I, and the frequency of the output clock Q2 becomes half the frequency of the input clocks Q1. Therefore, the frequency division circuit functions as a frequency half-reducing circuit. The frequency compensator 500 may receive information on the changed frequency of the sub clock 210 from the second counter 400 and may provide compensated frequencies 510 with different frequency division ratios.

Figure 2:
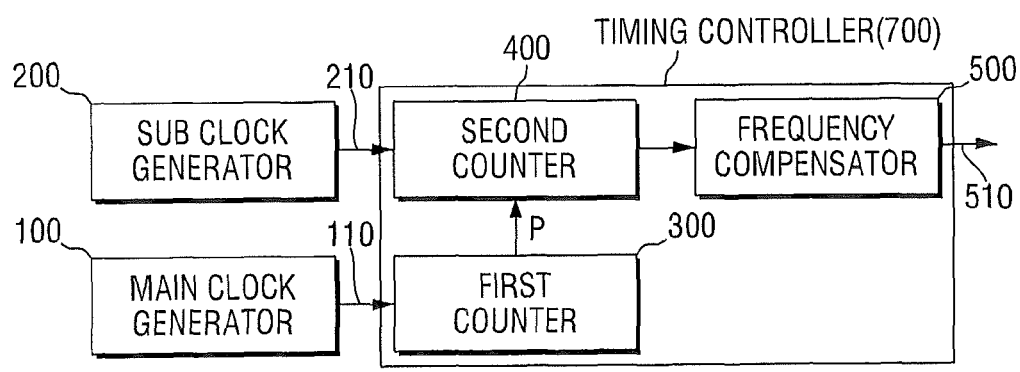
FIG. 2 is a block diagram of an apparatus for frequency compensation according to another embodiment of the present inventive concepts.

FIG. 2 is a block diagram of an apparatus for frequency compensation according to another embodiment of the present inventive concepts.

For the sake of convenient explanation, the following description will focus on differences between the frequency compensation apparatuses according to the present and previous embodiments.

Referring to FIG. 2, the frequency compensation apparatus according to another embodiment of the present inventive concepts further includes a timing controller 700 incorporating a first counter 300 and a second counter 400, compared to the frequency compensation apparatus according to the previous embodiment.

The timing controller 700 is mounted on a large-scale LCD panel for use in, for example, an LCD monitor, a notebook computer, or a TV. The timing controller 700 is a semiconductor for a display, which controls an amount of data transmitted to LCD driving chips and improves picture quality. The timing controller 700 receives image information from a tutor and a graphic card and transmits the received image information to each LCD driving chip. The LCD driving chip receives the image information and transmits the same to an LCD screen. As the size of an LCD panel increases, a time difference may be produced in the course of transmitting the image information to the LCD screen, resulting in a residual image on the LCD screen. To avoid this, the large-scale LCD panel uses the timing controller 700 that collectively controls the time difference between signals. The timing controller 700 may incorporate the first counter 300 and the second counter 400.

Figure 3:
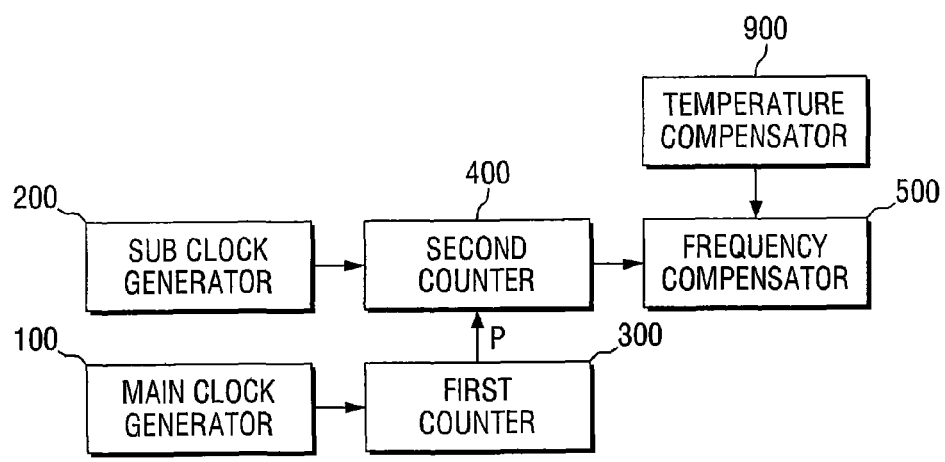
FIG. 3 is a block diagram of an apparatus for frequency compensation according to still another embodiment of the present inventive concepts.

FIG. 3 is a block diagram of an apparatus for frequency compensation according to still another embodiment of the present inventive concepts.

For the sake of convenient explanation, the following description will focus on differences between the frequency compensation apparatuses according to the present and previous embodiments.

Referring to FIG. 3, the frequency compensation apparatus according to another embodiment of the present inventive concepts further includes a temperature compensator 900 that compensate for the changed frequency of a sub clock 210 according to a change in the temperature, compared to the frequency compensation apparatus according to the previous embodiment.

The temperature compensator 900 senses a change in the frequency of the sub clock 210 depending on the temperature change and may provide a compensated frequency using the changed frequency information of the sub clock 210. The temperature compensator 900 may include a voltage supply, a transistor, a current mirror, and a resistor. The voltage supply may supply a constant voltage (e.g., 3.3V). The voltage supplied from the voltage supply may differ according to the use of the temperature compensator 900. The transistor is connected to the voltage supply and receives the voltage supplied from the voltage supply and outputs current (Id), a current mirror, and a resistor. The transistor changes the output current Id in proportion to the temperature. That is to say, if the temperature rises, the transistor increases the output current Id, and vice versa. The transistor having such a temperature characteristic may be, for example, a metal oxide semiconductor (MOS) transistor. The MOS transistor may be a PMOS transistor or an NMOS transistor. In the PMOS transistor, for example, a source is connected to the voltage supply, and a gate and a drain are connected to the current mirror. When the voltage is supplied from the voltage supply, the PMOS transistor is turned on and outputs the current Id.

Figure 4:
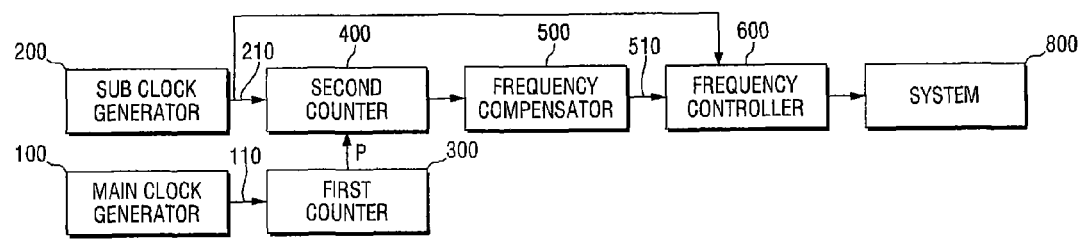
FIG. 4 is a block diagram of an apparatus for frequency compensation according to still another embodiment of the present inventive concepts.

FIG. 4 is a block diagram of an apparatus for frequency compensation according to still another embodiment of the present inventive concepts.

For the sake of convenient explanation, the following description will focus on differences between the frequency compensation apparatuses according to the present and previous embodiments.

Referring to FIG. 4, the frequency compensation apparatus according to another embodiment of the present inventive concepts further includes a frequency controller 600 that receives a compensated frequency 510 for a sub clock 210, compared to the frequency compensation apparatus according to the previous embodiment.

The frequency controller 600 may include a phase comparator, a low pass filter (LPF), and a voltage controlled oscillator (VCO). The phase comparator measures a difference between phases of an input signal and a fed-back signal of the sub clock 210 and outputs a voltage proportional to the phase difference. The LPF removes $R^F$ components of the phase difference between the signals output from the phase comparator, and applies a control voltage for changing a VCO frequency to the VCO to reduce a phase difference between the VCO signal and the input signal of the sub clock 210. The VCO is an oscillator that generates the frequency controlled according to the control signal. The frequency controller 600 may be, for example, an analog phase locked loop (APLL) circuit, a digital phase locked loop (DPLL) circuit, or an all digital phase locked loop (ADPLL) circuit, but not limited thereto.

Figure 5:
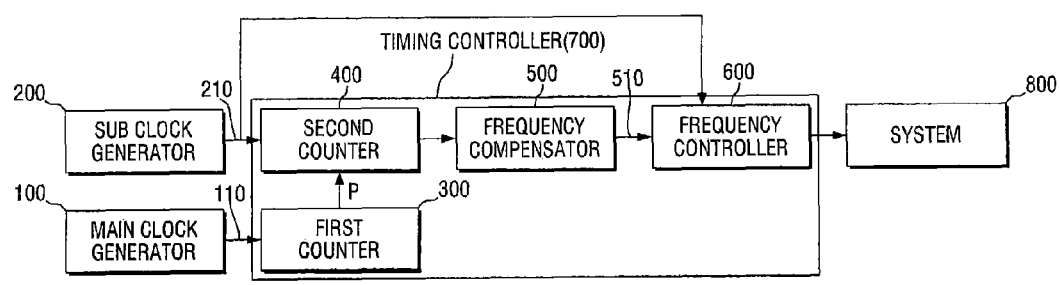
FIG. 5 is a block diagram of an apparatus for frequency compensation according to still another embodiment of the present inventive concepts.

FIG. 5 is a block diagram of an apparatus for frequency compensation according to still another embodiment of the present inventive concepts.

For the sake of convenient explanation, the following description will focus on differences between the frequency compensation apparatuses according to the present and previous embodiments.

Referring to FIG. 5, the frequency compensation apparatus according to another embodiment of the present inventive concepts further includes a timing controller 700 incorporating a frequency controller 600 providing a compensated frequency for the changed frequency of a sub clock 210, a first counter 300 and a second counter 400, compared to the frequency compensation apparatus according to the previous embodiment.

The frequency controller 600 may include a phase comparator, a low pass filter (LPF), and a voltage controlled oscillator (VCO). The phase comparator measures a difference between phases of an input signal and a fed-back signal of the sub clock 210 and outputs a voltage proportional to the phase difference. The LPF removes RF components of the phase difference between the signals output from the phase comparator, and applied a control voltage for changing a VCO frequency to the VCO to reduce a phase difference between the VCO signal and the input signal of the sub clock 210. The VCO is an oscillator that generates the frequency controlled according to the control signal. The frequency controller 600 may be, for example, an analog phase locked loop (APLL) circuit, a digital phase locked loop (DPLL) circuit, or an all digital phase locked loop (ADPLL) circuit, but not limited thereto.

The timing controller 700 may incorporate the first counter 300 and the second counter 400.

Hereinafter, a method for frequency compensation according to an embodiment of the present inventive concepts will be described with reference to FIGS. 6 to 9. FIGS. 6 to 9 are diagrams illustrating a method for frequency compensation according to an embodiment of the present inventive concepts.

Figure 6:
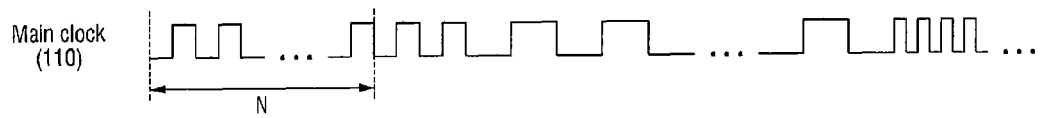
FIGS. 6 to 9 are diagrams illustrating a method for frequency compensation according to an embodiment of the present inventive concepts.
Figure 7:

First, referring to FIGS. 6 and 7, a main clock 110 is generated. An initial frequency of the main clock 110 is a first frequency, and the frequency of the main clock 110 may vary with the passage of time. The first counter 300 sets a reference period P using a period in which the frequency of the main clock 110 is the first frequency.

The setting of the reference period P comprises setting the number of reference clocks (N) for the main clock 110, and setting the reference period P by calculating a time taken to calculate the number of reference clocks (N).

In the period in which the frequency of the main clock 110 is the first frequency, the number of reference clocks N is set to an arbitrary number using the known frequency of the main clock 110, the reference period P is set to be constant. Since an application (for example, a flat panel display application) starts an initial sequence with a predetermined frequency when it is initially booted, and the value of the predetermined frequency is a stable frequency value determined by the developer of the application, a code value according to the predetermined frequency may be applied to a clock generator control logic as an input. For example, if the predetermined frequency of the main clock 110 is 100 MHz and the number of reference clocks (N) is set to 2000, the reference period P is set to 20 μs.

Figure 8:
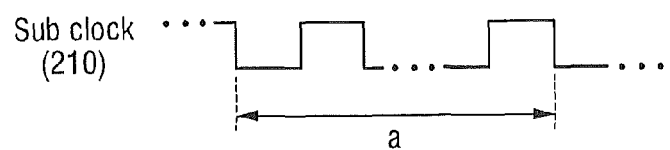
Figure 9:
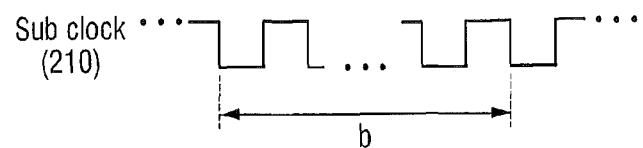

Referring to FIGS. 8 and 9, a change in the frequency of a sub clock 210 may be sensed using the reference period P. The sensing of the frequency change of the sub clock 210 may include sensing the frequency change of the sub clock 210 by calculating the number of clocks (a or b) of the sub clock 210 for a time taken to set the reference period P.

The second counter 400 may first calculate the number of clocks (a) of the sub clock 210 and may then calculate the frequency of the sub clock 210 using information on the reference period P received from the first counter 300. The frequency of the sub clock 210 varies according to the process, voltage and temperature change. Then, the second counter 400 may calculate again the frequency of the sub clock 210 using information on the reference period P to then sense a changed frequency of the sub clock 210. In the example stated above, when the number of clocks (a) of the sub clock 210 is 500, the frequency of the sub clock 210 is 25 MHz. In this case, when the frequency of a system 800 required by a user is 50 MHz, it can be sensed that a compensated frequency that is double the frequency of the sub clock 210 is required. In addition, when the number of clocks (b) of the sub clock 210 is 1000, the frequency of the sub clock 210 is 50 MHz. In this case, since the frequency of the sub clock 210 is equal to that of the system 800, it can be sensed that the frequency of the sub clock 210 needs not to be compensated for.

The information on the changed frequency of the sub clock 210 is transmitted to the frequency compensator 500, and the frequency compensator 500 sets a different frequency division ratio to then provide a compensated frequency of the sub clock 210 to the frequency controller 600. The frequency compensator 500 may compensate for the frequency change of the sub clock 210 according to the process, voltage and temperature by continuously using the information on the changed frequency of the sub clock 210 and by continuously setting a relative value of the frequency division ratio.

Figure 10:
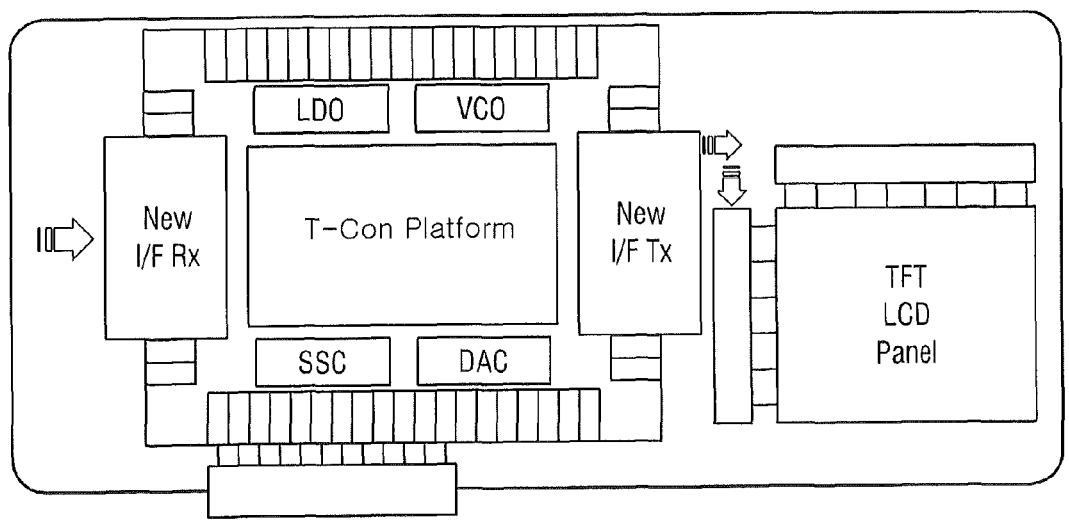
FIG. 10 illustrates an exemplary display system to which apparatus for frequency compensation according to some embodiments of the present inventive concepts can be applied.

FIG. 10 illustrates an example display system to which apparatuses for frequency compensation according to some embodiments of the present inventive concepts can be applied.

Specifically, FIG. 10 is a layout view of an LCD panel. The frequency compensation apparatus according to the embodiment of the present inventive concepts may be applied to a spread spectrum clock (SSC), but aspects of the present inventive concepts are not limited thereto. For example, in a case where 50 KHz is required as the SSC modulation frequency, if the sub clock 210 has an initial frequency of 50 MHz and a changed frequency of 25 MHz, the frequency of the sub clock 210 is compensated using a frequency division ratio, i.e., 1/500, which is two times the initial frequency division ratio, 1/1000, and transmits the compensated frequency to the SSC. It will be understood by one skilled in the art that the frequency compensation apparatus according to some embodiments of the present inventive concepts can be applied to other systems not illustrated herein.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. An apparatus for frequency compensation comprising:
   a first counter configured to set a reference period using a main clock;
   a second counter configured to sense a change in the frequency of a sub clock using the reference period; and
   a frequency compensator configured to provide a compensated frequency using the change in the frequency of the sub clock,
   wherein the first counter is further configured to set a number of reference clock cycles for the main clock and to set the reference period by measuring a time taken to count the number of reference clock cycles,
   wherein the second counter is further configured to sense the change in the frequency of the sub clock by counting a number of clock cycles of the sub clock corresponding to a time taken to set the reference period, and
   wherein the first counter is further configured to set and store the reference period, and the second counter is further configured to sense the change in the frequency of the sub clock using the reference period stored by the first counter.

2. The apparatus of claim 1, wherein an initial frequency of the main clock is a first frequency, the frequency of the main clock varies with the passage of time, and the first counter is further configured to set the reference period using a period in which the frequency of the main clock is the first frequency.

3. The apparatus of claim 1, wherein the second counter includes a plurality of second counters.

4. The apparatus of claim 1, further comprising a timing controller including the first and second counters.

5. The apparatus of claim 1, further comprising a frequency controller configured to receive the compensated frequency.

6. The apparatus of claim 1, further comprising a temperature compensator configured to sense the change in the frequency of the sub clock depending on a temperature change and to provide a compensated frequency based on the change in the frequency of the sub clock.

7. An apparatus for frequency compensation comprising:
   a first clock generator configured to generate a first clock;
   a second clock generator configured to generate a second clock;
   a first counter that is configured to count clock cycles of the first clock and identify a time duration for the first clock to produce a predetermined number of the clock cycles;
   a second counter that is configured to count clock cycles of the second clock during a plurality of time intervals corresponding to the time duration and to determine a change in a frequency of the second clock from the clock cycles of the second clock that are counted during the plurality of time intervals corresponding to the time duration; and
   a frequency compensator that is configured to produce a frequency compensation value from the change in the frequency of the second clock.

8. The apparatus of claim 7 wherein the first clock generator comprises a crystal oscillator and the second clock generator comprises a capacitor-based oscillator.

9. The apparatus of claim 8 wherein the frequency compensator comprises a frequency divider that is configured to set a frequency division ratio based on the change in the frequency of the second clock.

10. The apparatus of claim 9 further comprising a phase locked loop that is responsive to the frequency divider.

11. The apparatus of claim 7 wherein the predetermined number of clock cycles corresponds to an initial operation frequency of the first clock.

* * * * *